United States Patent
Swaminathan et al.

(10) Patent No.: US 9,634,676 B2
(45) Date of Patent: Apr. 25, 2017

(54) CIRCUITS AND METHODS PROVIDING CLOCK FREQUENCY ADJUSTMENT IN RESPONSE TO SUPPLY VOLTAGE CHANGES

(71) Applicant: QUALCOMM Incorporated, San Diego, CA (US)

(72) Inventors: Ashok Swaminathan, Cardiff, CA (US); Christian Venerus, San Diego, CA (US); Marzio Pedrali-Noy, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 43 days.

(21) Appl. No.: 14/789,095

(22) Filed: Jul. 1, 2015

(65) Prior Publication Data

US 2017/0005665 A1    Jan. 5, 2017

(51) Int. Cl.
  *H03L 7/06*    (2006.01)
  *H03L 7/099*   (2006.01)
  *H03B 5/04*    (2006.01)
  *H03L 1/00*    (2006.01)

(52) U.S. Cl.
  CPC .............. *H03L 7/099* (2013.01); *H03B 5/04* (2013.01); *H03L 1/00* (2013.01); *H03B 2202/042* (2013.01); *H03B 2202/06* (2013.01)

(58) Field of Classification Search
  CPC ......... G06F 1/26; G06F 1/3206; H02M 3/156
  See application file for complete search history.

(56) References Cited

U.S. PATENT DOCUMENTS

| 7,133,751 | B2  | 11/2006 | Kurd et al. |
| 8,461,883 | B2  | 6/2013  | Hsu et al. |
| 8,604,852 | B1  | 12/2013 | Turullols et al. |
| 8,933,737 | B1  | 1/2015  | Chatterjee et al. |
| 2004/0183613 | A1 | 9/2004 | Kurd et al. |
| 2005/0218955 | A1 | 10/2005 | Kurd et al. |
| 2006/0097805 | A1* | 5/2006 | Bas ........................ H03K 3/011 331/57 |
| 2012/0187991 | A1 | 7/2012 | Sathe et al. |

(Continued)

OTHER PUBLICATIONS

International Search Report and Written Opinion—PCT/US2016/035345—ISA/EPO—Oct. 18, 2016.

(Continued)

*Primary Examiner* — Sibin Chen
(74) *Attorney, Agent, or Firm* — Haynes and Boone, LLP (57) ABSTRACT

Methods, systems, and circuits for providing compensation for voltage variation are disclosed. A system includes: a voltage comparator configured to assert a control signal in response to detecting that one or more of power supply voltages droops below a threshold amount; a phase locked loop (PLL) configured to divide an output frequency for the PLL in response to the assertion of the control signal; a plurality of voltage sensors corresponding to the plurality of power supply voltages, the voltage sensors configured to output respective digital signals indicative of a voltage level of its corresponding power supply voltage; and a control circuit configured to control an oscillator frequency in the PLL during the open-loop mode responsive to the respective digital signals.

28 Claims, 5 Drawing Sheets

(56) References Cited

U.S. PATENT DOCUMENTS

2014/0254734 A1* 9/2014 Abdelmoneum ..... H03L 7/0995
  375/376
2014/0359323 A1* 12/2014 Fullerton ................ G06F 1/206
  713/320

OTHER PUBLICATIONS

Bowman, K.A., et al., "A 22 nm All-Digital Dynamically Adaptive Clock Distribution for Supply Voltage Droop Tolerance," IEEE Journal of Solid-State Circuits, vol. 48, No. 4, Apr. 2013, IEEE, pp. 907-916.
Grenat, A., et al., "Adaptive Clocking System for Improved PowerEfficiency in a 28nm ×86-64 Microprocessor," 2014 IEEE International Solid-State Circuits Conference Digest of Technical Papers (ISSCC), Feb. 9-13, 2014, San Francisco, CA, IEEE, pp. 106-107.
Muhtaroglu A., et al., "On-Die droop detector for Analog Sensing of power supply Noise",<span style="font-family: calibri;">IEEE Journal of Solid-State Circuits, IEEE Service Centre, Picatsway, NJ,USA,vol. 39, No. 4, Apr. 1, 2004 (Apr. 1, 2004), pp. 651-660, XP011109682.

\* cited by examiner

CIRCUITS AND METHODS PROVIDING CLOCK FREQUENCY ADJUSTMENT IN RESPONSE TO SUPPLY VOLTAGE CHANGES

TECHNICAL FIELD

This application relates to clock frequency adjustment, and more specifically, to circuits and methods that adjust a clock frequency in response to supply voltage changes.

BACKGROUND

A power supply in a mobile computing device, such as a smart phone, is designed with multiple operating constraints in mind. One such operating constraint includes the non-constant current draw that is expected of a processing core. Specifically, generally it is expected that a processing core will draw a relatively high amount of current during a processing operation, but may be idle or nearly idle and have much lower current consumption during other times. However, abrupt changes in current consumption may cause a voltage on a voltage rail to droop.

An operating voltage provided by a voltage rail may affect the timing of various circuits in a processor core. For instance, it is generally the case that a lower supply voltage may result in somewhat slower operation of components, such as transistors. Furthermore, a processing core may have multiple critical paths, where a critical path is typically an identified path for data signals having a delay from beginning to end that is higher than that of other paths. Thus, processors are often designed with the critical paths in mind, where critical paths are considered worst-case paths that when satisfied provide assurance that the other paths have correct timing.

In some scenarios, it may be expected that a droop in supply voltage may slow transistor operation enough that timing errors may occur in one or more critical paths. Therefore, conventional processors are often designed having a higher operating voltage so that droops do not go below a voltage where timing errors would be expected to occur. However, that added operating voltage level ("voltage margin") comes at a price of higher power consumption.

Accordingly, there is a need in the art for improved detection of voltage changes and resulting compensation of the detected voltage changes.

SUMMARY

Methods, systems, and circuits for compensating for detected voltage changes are provided. One embodiment includes a system having a coarse frequency control system and a fine frequency control system. The coarse frequency control system includes a voltage comparator that monitors voltages on a plurality of voltage rails for droop and is configured to cause an oscillator circuit to enter an open-loop mode and to perform a frequency divider operation. Therefore, when voltage droops to a level that might otherwise be expected to cause a timing error in a critical path, the coarse frequency control system reduces the clock frequency (output from the oscillator circuit), to a frequency that would be expected to operate without timing errors in the critical path at the drooped voltage.

The example system further includes the fine frequency control system. The fine frequency control system has a plurality of voltage sensors, where each of the voltage sensors corresponds to a voltage rail. The voltage sensors monitor the operating voltages and output digital signals indicative of the voltages they measure. A controller receives the digital signals from the voltage sensors and controls the oscillator circuit to reduce or increase an oscillator frequency in response to the sensed voltages. Therefore, when the control circuit receives digital signals indicating that at least one of the supply voltage levels is low, the control circuit reduces an oscillator frequency of the oscillator circuit. The coarse control system and the fine control system work together in this example. In such an example system, the reduction in frequency can be made in lieu of adding voltage margin, thereby reducing power consumption when compared to a conventional system having added voltage margin.

Another example embodiment includes a method for operating a system, such as the one described above. The example method includes monitoring a plurality of voltage levels at a voltage comparator and at a plurality of voltage sensors. The method is configured to adjust a clock frequency for a processor core in response to voltage variations of the supply voltage. The method further includes generating a control signal by the voltage comparator in response to determining that one or more of the input voltages is below a voltage threshold level. The control signal causes the oscillator circuit to enter an open-loop operating mode and to divide an output frequency of the oscillator circuit. Additionally, the method includes the plurality of voltage sensors generating frequency adjustment signals in response to the plurality of input voltages. A control circuit then adjusts an oscillator frequency of the oscillator circuit in response to the frequency adjustment signals.

DETAILED DESCRIPTION

To provide improved detection and compensation of voltage variation, a dual-detection compensation technique is provided that includes a coarse detection and compensation system as well as a fine detection and compensation system. The coarse detection and compensation system makes a coarse adjustment (e.g., dividing a clock frequency by two), but offers relatively quick reaction to voltage variation. The fine detection and compensation system makes a more finely granular adjustment to the clock or oscillator frequency, but reacts more slowly than does the coarse detection and compensation system. Both the fine and coarse systems may be used together to provide effective reaction to some voltage variation phenomena while providing a more gradual frequency recovery of the clock.

Figure 1:
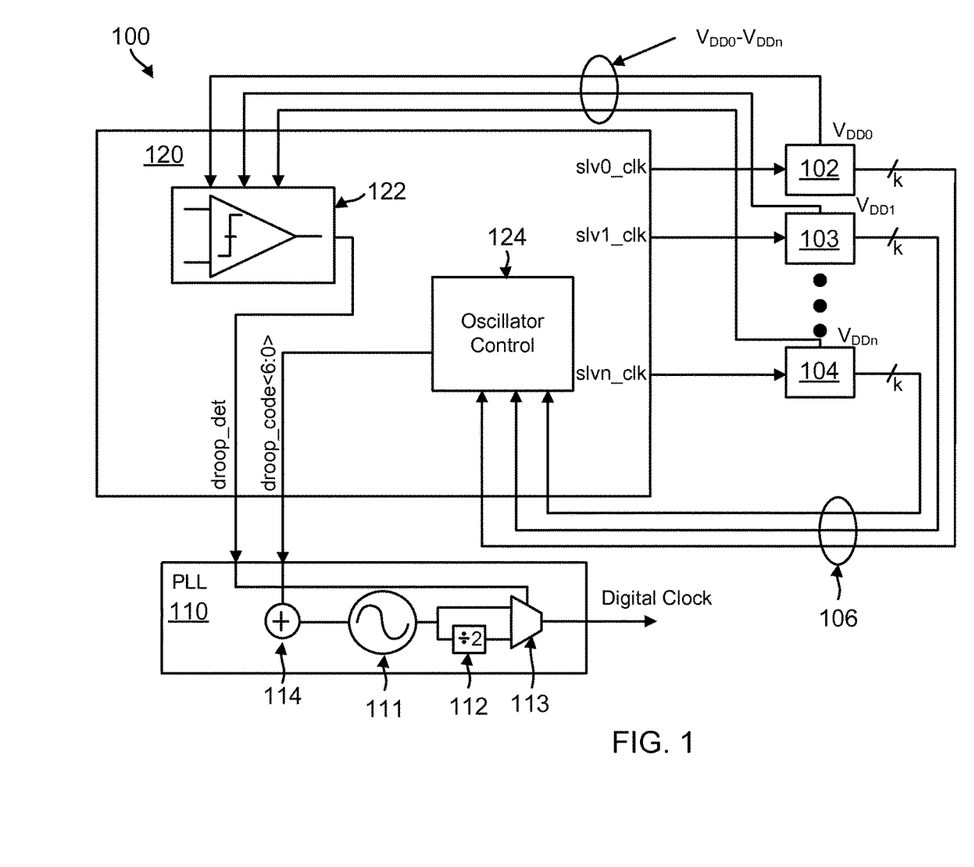
FIG. 1 is a simplified block diagram of an example system for adjusting a clock frequency in response to voltage variation, according to one embodiment.

FIG. 1 is an illustration of an example clock frequency control system 100, according to one embodiment. System 100 includes a control portion 120 and an oscillator circuit 110. System 100 also includes voltage sensors 102-104. In this example, there are three voltage inputs shown, and they are labeled VDD0-VDDn. FIG. 1 shows three voltage inputs for convenience, however, it is understood that various embodiments may include any appropriate number of voltage signals (i.e., n may be any appropriate integer).

The voltage inputs VDD0-VDDn are derived from a voltage supply, such as a power management integrated circuit (PMIC) or other device. In this example, each of the voltage inputs VDD0-VDDn corresponds to a respective voltage rail, where each of the voltage rails may independently power one or more processing cores or other circuitry (not shown). Further in this example, each of the voltage inputs VDD0-VDDn ideally provides a particular voltage level (e.g., 1.5 V), but each one of the voltage inputs may experience voltage droop due to the power consumption of various loads and/or other phenomena such as resonance in a power delivery network. As explained further below, system 100 of FIG. 1 monitors the voltage level and reduces the frequency of the clock (labeled "Digital Clock") as appropriate so as to avoid timing errors in critical paths.

Voltage sensors 102-104 each sense a respective voltage level at a respective voltage input VDD0-VDDn. Voltage sensors 102-104 output digital signals 106 indicative of a respective voltage level. For example, voltage sensor 102 may include an analog-to-digital converter which outputs a k-bit digital signal indicative of the voltage level of VDD0 at each rising or falling edge of clock slv0_clk (where k is an integer, such as 8, and slv0_clk is at a lower frequency than Digital Clock). Therefore, as the voltage level of VDD0 varies, voltage sensor 102 outputs a digital signal that also varies according to the measured voltage level. The other voltage sensors 103 and 104 operate in a similar manner. Furthermore, while FIG. 1 shows only three voltage sensors 102-104, it is understood that various embodiments may include any appropriate number of voltage sensors, such as one voltage sensor for each respective voltage input VDD0-VDDn. Control circuit 124 receives the digital signals 106 and adjusts an oscillator frequency accordingly via control signal droop_code. This is described in more detail below.

Control portion 120 also includes voltage comparator 122. The voltage comparator 122 receives voltage inputs VDD0-VDDn and asserts a signal droop_det when one or more of the voltage inputs VDD0-VDDn experiences a voltage level below a threshold. For instance, one example includes a system designed so that a voltage drop of more than 25 mV is considered a droop and causes comparator 122 to assert the signal droop_det. However, 25 mV is a number for illustration, and it is understood that other embodiments may use any appropriate threshold level.

In the example of FIG. 1, it is expected that comparator 122 may act more quickly than the control provided by voltage sensors 102-104 and control circuit 124. Thus, comparator 122 is used as part of a coarse control system, whereas sensors 102-104 and control circuit 124 are used as a fine control system. As explained further below, system 100 uses the coarse control system and the fine control system together to adjust a frequency of the clock in response to detection of voltage variation.

System 100 also includes oscillator circuit 110, which in this case, is a digitally controlled phase locked loop (PLL). Digital control 114 controls the frequency of oscillator 111. For instance, digital control 114 may receive digital signal droop_code and vary the frequency of oscillator 111 up or down in response thereto. Oscillator circuit 110 also includes frequency divider 112, which in this instance is a divide-by-two divider; however, various embodiments may include any appropriate divider ratio. Oscillator circuit 110 further includes multiplexer 113, which outputs either the oscillator frequency or the divided frequency as the Digital Clock.

Although not explicitly shown in FIG. 1, oscillator circuit 110 includes an open-loop operating mode and a closed-loop operating mode. In the closed-loop operating mode, the output of the oscillator is fed back to control 114 that compares the output to a reference frequency, and control 114 then adjusts the frequency of oscillator 111 in order to reduce any error. In the open-loop mode of operation, control 114 does not attempt to minimize the error nor measure the error, but instead controls oscillator according to input received at droop_code without the benefit of measuring error.

An example use case is as follows. A plurality of voltage rails, each corresponding to one of the voltage inputs VDD0-VDDn provides power to a plurality of processing cores or other circuits. The voltage inputs VDD0-VDDn are monitored by the high-speed comparator 122 as well as by the voltage sensors 102-104. In any given system, there may be a variety of reasons that voltage may vary, and voltage variation may manifest itself in a variety of different phenomenon. In one particular example, power delivery network resonance may cause a voltage droop of a magnitude that might otherwise be expected to cause a timing error in a critical path, where that voltage droop may last around 10 clock cycles or so. In this example, voltage sensors 102-104 and controller 124 are configured to provide frequency adjustment in response to voltage variations that are substantially longer in duration than 10 clock cycles (e.g., 15 clock cycles at a minimum). By contrast, comparator 122 is configured to assert its control signal droop_det on a next clock cycle after having detected the droop.

Upon detecting the voltage droop, comparator 122 asserts it signal droop_det, which causes oscillator circuit 110 to enter an open-loop operating mode and to select the divided frequency output using multiplexer 113. Therefore, within one or two clock cycles, system 100 reacts to the voltage drop by dividing the clock frequency by two. The processing cores or other circuits (not shown) receive the clock signal at the lower frequency and thus do not suffer from timing errors while the voltage is low. Further in this example, there is a counter (not shown) at either control portion 120 or oscillator circuit 110 which maintains the open-loop mode and the frequency dividing operation for a pre-programmed period of time (e.g., 10 clock cycles).

At the same time that comparator 122 senses the voltage levels on VDD0-VDDn, voltage sensors 102-104 also sense the same voltage levels and output digital signals 106 in response thereto. Control circuit 124 receives digital signals 106 and programmatically determines whether to adjust a frequency of oscillator 111 based on voltage variation. Although each of the voltage sensors 102-104 may output a voltage signal at each clock cycle, it may take several clock cycles for control circuit 124 to programmatically responds to voltage variation. Control circuit 124 may provide more finely tuned control over the frequency, allowing for greater granularity than a simple divide by two. For instance, for a 2 GHz clock, control circuit 124 may provide control of a granularity of 100 MHz or less. However, it is understood that any appropriate level of granularity may be provided by control circuit 124 in various embodiments.

Control circuit 124 receives digital signals 106 and, in response to the indications of voltage levels by digital signals 106, adjusts the oscillating frequency of oscillator 111 via control signal droop_code. For instance, as control circuit 124 senses that one or more of the voltage levels are decreasing, control circuit 124 may then use control signal droop_code to adjust a frequency of oscillator 111 down as well. Also, as control circuit 124 senses that the voltage levels are recovering to a normal operation level, control circuit 124 uses signal droop_code to adjust the frequency of oscillator 111 up to a normal operating frequency.

At this point, comparator 122 has already caused the frequency of Digital Clock to be cut in half, and control circuit 124 is just now reacting to the voltage droop. Control circuit 124 adjusts the frequency of the oscillator 111 down as well, thereby further decreasing the rate of Digital Clock. Eventually, the pre-programmed time in which the frequency is halved comes to an end, and multiplexer 113 selects the undivided oscillator frequency, so that the frequency of Digital Clock doubles. By this point, the voltage droop will have mostly abated, and system 100 will use the fine control of the control circuit 124 to return the frequency of Digital Clock back to its normal operating frequency. Then, oscillator circuit 110 returns to an open-loop operating mode, and the system 100 resets the comparator 122.

Figure 2:
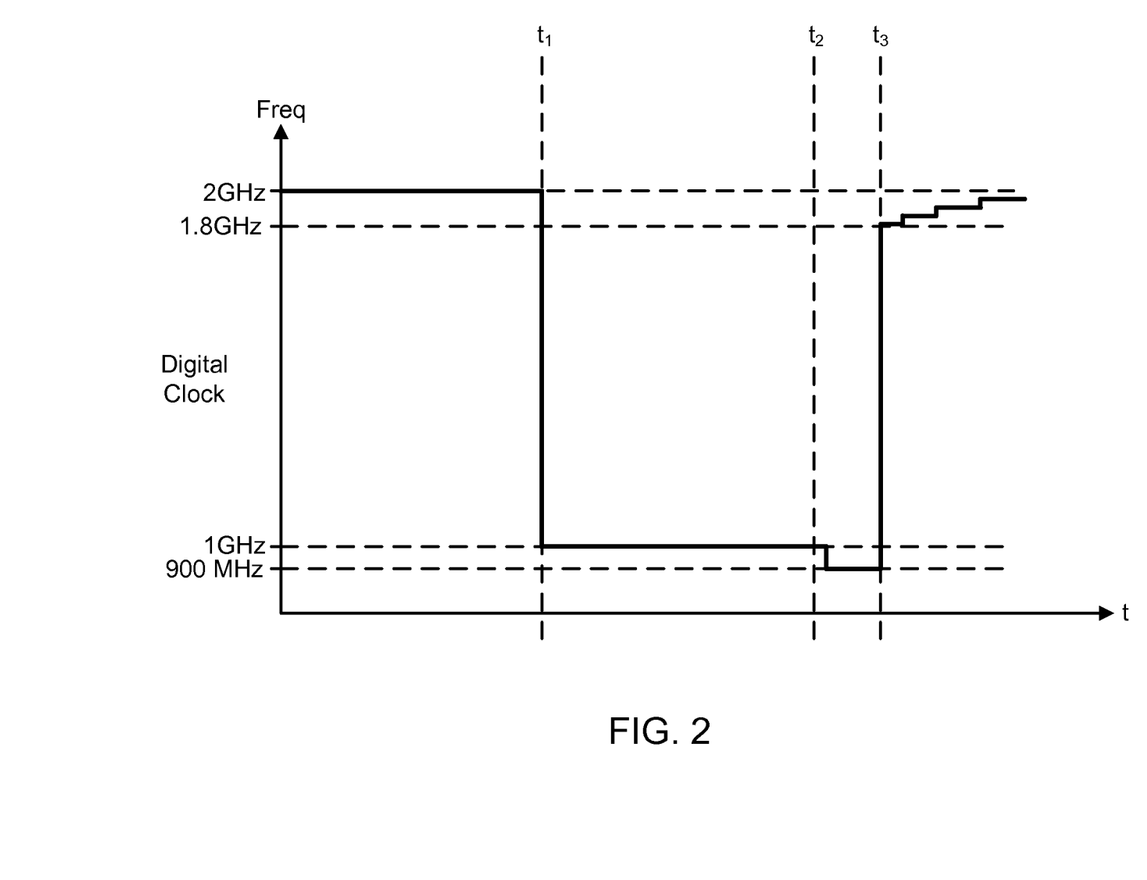
FIG. 2 is a timing diagram illustration showing the operation of the system of FIG. 1, according to one embodiment.

This process is described in more detail with respect to FIG. 2. FIG. 2 is a timing diagram of the frequency of Digital Clock versus time, according to one embodiment. In FIG. 2, Digital Clock is operating at 2 GHz during normal operation. At time t1, comparator 122 detects the voltage droop and asserts signal droop_det to cause oscillator circuit 110 to go into an open-loop mode and to output the frequency-divided signal, so that Digital Clock goes to 1 GHz. This happens relatively quickly, for example within one or two clock cycles.

System 100 is programmed so that the divided signal is output by multiplexer 113 for a fixed period of time. For instance, system 100 may include a control processor (not shown) within oscillator circuit 110 or within control portion 120 which is programmed to maintain a frequency dividing operation for a particular period of time. The scope of embodiments is not limited to any particular control processor. This period of time is represented by the period that elapses between time t1 and time t3.

As time elapses, the fine control system begins to react to the voltage droop as well at time t2. Control circuit 124 provides digital control signal droop_code to cause oscillator 111 to slow down. In this example, control circuit 124 causes oscillator 111 to slow down from 2 GHz to 1.8 GHz. However, since the output is divided by two, Digital Clock is one half of 1.8 GHz, or 900 MHz.

At time t3, the pre-programmed time for the frequency dividing operation is ended, and multiplexer 113 outputs the undivided oscillator frequency, so that Digital Clock is at 1.8 GHz. The pre-programmed time may be designed in some embodiments so that it lasts almost as long as a power delivery network resonance-induced voltage droop would be expected to last. In other words, at time t3 the voltage droop has mostly abated. Oscillator circuit 110 is still in an open-loop mode, and it is controlled by control circuit 124 according to signal droop_code after time t3.

The fine frequency control provided by voltage sensors 102-104 and control circuit 124 is used to recover the clock frequency back to its normal frequency, 2 GHz. As the voltage level recovers, control circuit 124 raises the frequency from 1.8 GHz to 2 GHz after time t3. Once the voltage and frequency are back to a normal level, system 100 puts the oscillator circuit 110 back into a closed-loop operating mode and resets comparator 122 so that comparator 122 may detect a subsequent voltage droop, if any.

The embodiment described above may include one or more advantages as compared to conventional solutions. For instance, when compared to a conventional solution that adds voltage margin to compensate for voltage droop, the embodiment described above may save power by reducing or eliminating the use of voltage margin in the design. In other words, some embodiments may replace voltage margin with clock frequency reduction during a voltage droop, thereby avoiding timing errors but also avoiding extra power use caused by added voltage margin. However, the scope of embodiments does not exclude the use of adding voltage margin when appropriate.

Furthermore, the embodiment described above allows system 100 to return the frequency of Digital Clock to 2 GHz without using an abrupt jump directly to 2 GHz. Specifically, in the example of FIG. 2, the system 100 progresses from 1 GHz to 900 MHz and then to 1.8 GHz before recovering all the way to 2 GHz. By contrast, directly jumping from 1 GHz to 2 GHz might be expected in some situations to result in a step function which, itself, might result in another voltage droop.

Figure 3:
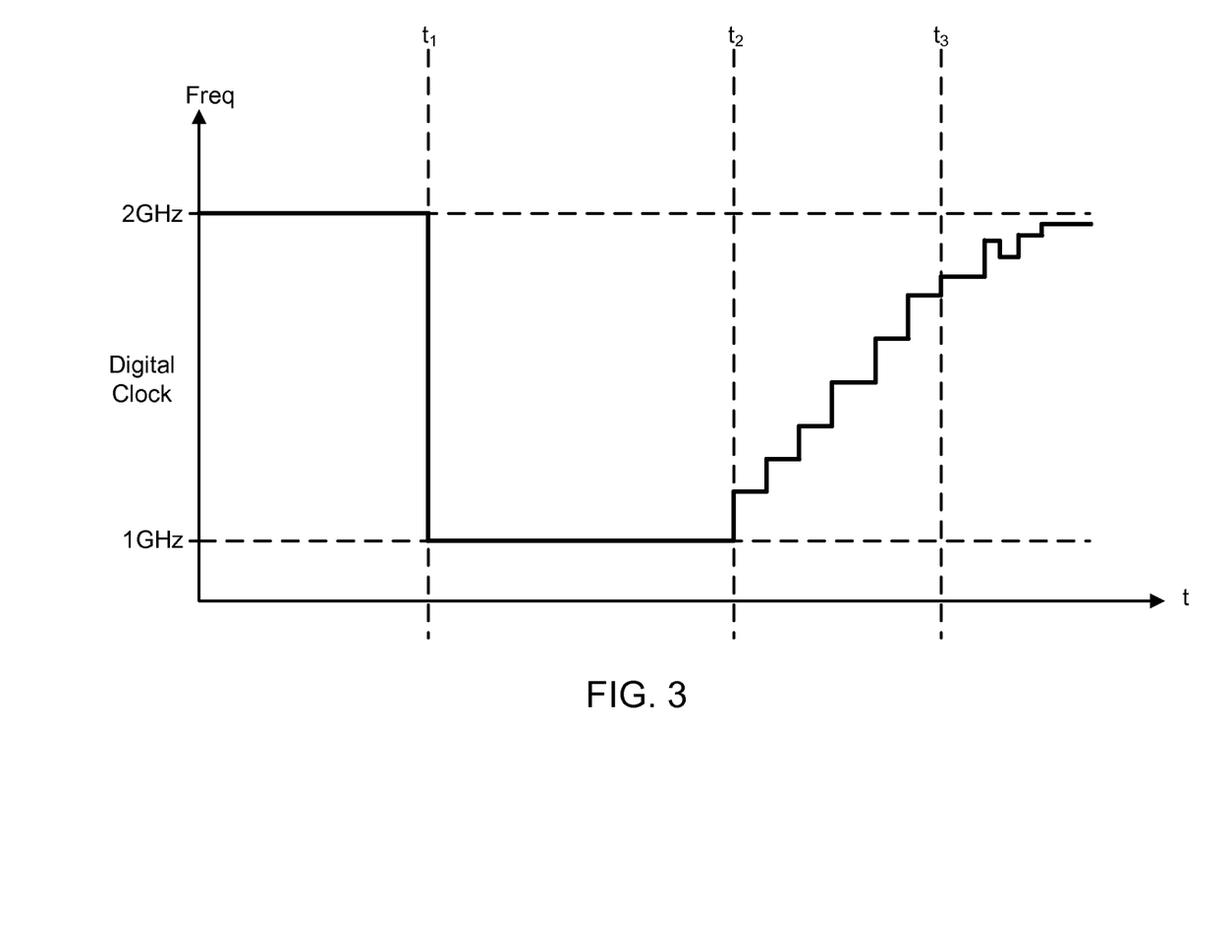
FIG. 3 is a timing diagram illustration showing the operation of the system of FIG. 1, according to one embodiment.

FIG. 3 is a timing diagram of the frequency of Digital Clock versus time, according to another embodiment. The timing diagram shown in FIG. 3 shows how the frequency of Digital Clock may be adjusted over time to compensate for voltage droop, such as an system 100 of FIG. 1. However, the timing diagram illustrated in FIG. 3 shows a somewhat different technique than that described with respect to FIG. 2.

Before time t1, the Digital Clock operates at a frequency of 2 GHz during normal operation. At time t1, the voltage comparator 122 detects the voltage droop and asserts signal droop_det to cause oscillator circuit 110 to go into an open-loop mode and to output the frequency divided signal, so that Digital Clock goes to 1 GHz. As with the embodiment of FIG. 2, this happens relatively quickly, for example within one or two clock cycles.

Furthermore, system 100 is programmed so that the divided signal is output by multiplexer 113 for a fixed period of time. For instance, system 100 may include a control processor (not shown) within oscillator circuit 110 or within control portion 120 which is programmed to maintain a frequency dividing operation for a particular period of time. This period of time is represented by the period that elapses between time t1 and time t2.

Beginning at time t2, the control processor within oscillator circuit 110 or the control portion 120 causes the multiplexer 113 to output the undivided oscillator signal. However, at the same time, the control processor within oscillator circuit 110 or the control portion 120 also controls oscillator 111 to reduce its oscillating frequency to just above 1 GHz. For example, oscillator 111 may be controlled to oscillate at 1.125 GHz or 1.25 GHz, which is shown as a stairstep shape beginning at time t2.

The time between t2 and t3 shows a stairstep mode in which the control processor within oscillator 110 or the control portion 120 iteratively steps up the frequency of Digital Clock over that span of time. In this example, the control processor within oscillator 110 or the control portion 120 is programmed to provide the stairstep mode, for example, in 125 MHz steps or 250 MHz steps for a pre-programmed number of steps or until the frequency of Digital Clock reaches a pre-programmed threshold. Also, each step may be a pre-programmed duration, such as 5 ns.

At time t3, oscillator circuit 110 is still operating within an open-loop mode, and it has not yet reached the normal operating frequency of 2 GHz. At time t3, the stairstep operation ends, and system 100 allows the fine control system (voltage sensors 102-104 and control circuit 124) to recover the clock frequency back to the normal operating frequency of 2 GHz. Once the voltage and frequency are back to a normal level, system 100 puts the oscillator circuit 110 back into a closed-loop operating mode and resets comparator 122 so that comparator 122 may detect a subsequent voltage droop, if any.

As with the embodiment described above with respect to FIG. 2, the embodiment of FIG. 3 may include a pre-programmed time of operation that is designed to be substantially similar to an expected voltage droop that may be due to power delivery network resonance. For instance, in FIG. 3, the total elapsed time between times t1 and t3 may be designed to be similar to or slightly less than an expected voltage droop.

Also, the embodiments of FIGS. 1-3 are described with respect to specific values for parameters, such as 2 GHz for a normal operating frequency or other values for voltage droop or stairstep timing. The specific values for parameters are provided for ease of illustration, and other embodiments may use different values for various parameters as appropriate.

Figure 4:
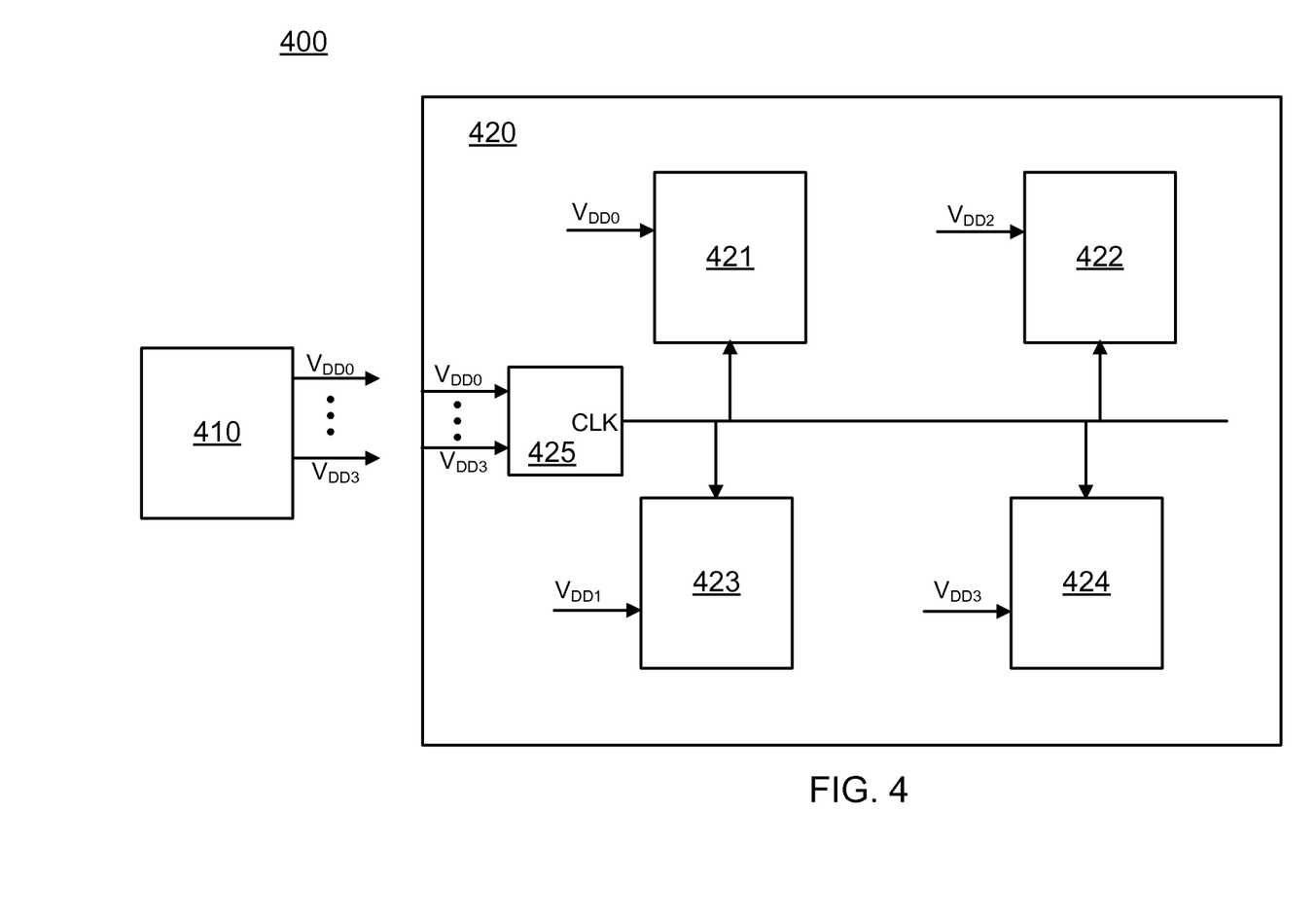
FIG. 4 is an illustration of an example application into which the system of FIG. 1 may be adapted, according to one embodiment.

FIG. 4 is an illustration of example system 400, adapted according to one embodiment. System 400 provides an example of a system in which the system 100 of FIG. 1 may be implemented.

System on chip (SOC) 420 in this example includes four different processing cores 421-424. Examples of processing cores include, e.g., wireless modems, Digital Signal Processors (DSPs), Graphics Processing Units (GPUs), and the like. The scope of embodiments may include any appropriate processing circuit and any appropriate number of processing circuits. In this example, the processing cores 421-424 receive a clock input CLK from clocking module 425.

System 400 further includes power module 410, which may include a power management integrated circuit (PMIC) or other appropriate module. In this example, the power module 410 is not included on the same chip as SOC 420, but the scope of embodiments is not limited to any particular arrangement of integrated circuits nor any particular design for an SOC. Power module 410 is shown with four normal outputs, VDD0-VDD3, which are provided to the cores 421-424. FIG. 4 shows power module 410 having four power outputs, but in other embodiments power module 410 may include a single power output on a main power rail, where switched power lines provide power from that power rail to a plurality of power sub-rails implemented as VDD0-VDD3. The scope of embodiments is not limited to any particular power architecture, nor to any particular number of power rails.

Further in this example, clocking module 425 is implemented with the functionality described above with respect to FIG. 1, so that the clock output CLK is comparable to the Digital Clock of FIG. 1. Clocking module 425 receives power inputs VDD0-VDD3 to monitor and react to the voltage variations and to use a coarse control system and a fine control system to adjust a frequency of the clock output CLK in response to voltage variations. Thus, if the voltage droop appears on one or more of the power inputs VDD0-VDD3, clocking module 425 may then adjust its oscillator frequency and its output clock frequency of CLK in response to that droop, as described above with respect to FIGS. 1-3.

Various embodiments may include one or more advantages over conventional solutions. For instance, some conventional solutions would include designing system 400 to include added voltage margin to prevent timing errors during voltage droops. However, the inclusion of clocking module 425 may allow a designer of system 400 to reduce or eliminate added voltage margin.

Figure 5:
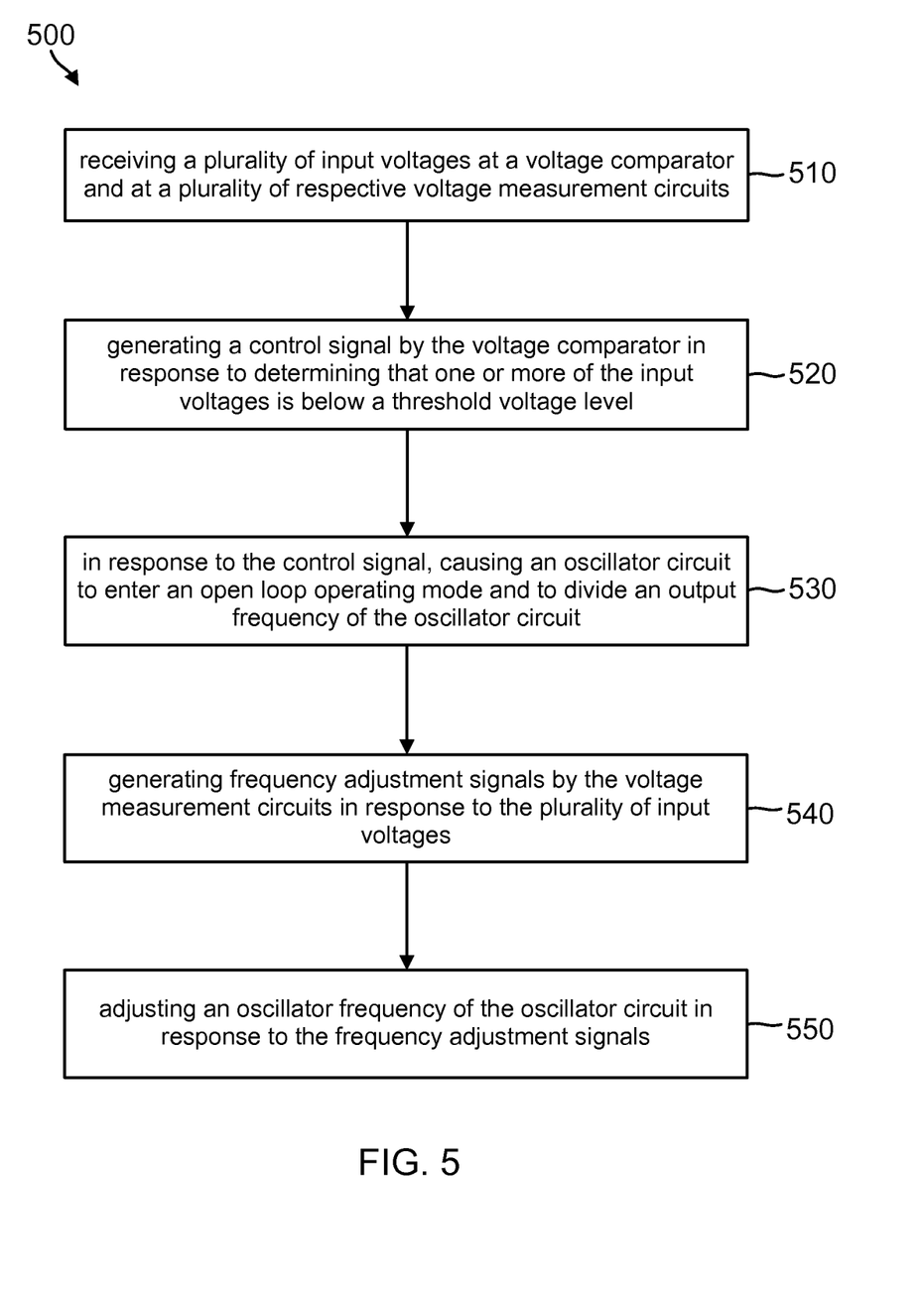
FIG. 5 is an illustration of an example method that may be performed by the circuits of FIG. 1, according to one embodiment.

FIG. 5 is an illustration of an example method 500, according to one embodiment. Method 500 may be performed by circuits, such as those shown in FIG. 1. Specifically, FIG. 1 shows a coarse control system including a voltage comparator 122 that outputs a digital signal droop_det, a fine control system including voltage sensors 102-104 and a control circuit 124. In some examples of method 500, the circuits of the fine control system and a coarse control system may perform the actions. In other embodiments, there may be one or more other control processors that specifically control the oscillator frequency, the open-loop or closed-loop operation of the oscillator circuit, and/or the dividing operation of the oscillator circuit. Various embodiments include the actions of method 500 being performed by any of the circuits or combination of the circuits as appropriate.

At action 510, the system receives a plurality of input voltages at a voltage comparator and at a plurality of respective voltage measurement circuits. An example is shown in FIG. 1, where the input voltages VDD0-VDDn are received by comparator 122 and by the voltage measurement circuits illustrated by voltage sensors 102-104 and control circuit 124. The voltages may be from the same power rail or from different power rails, and the number of input voltages n may be any appropriate integer.

At action 520, the voltage comparator generates a control signal in response to determining that one or more of the input voltages is below a threshold voltage level. In a scenario where the voltage comparator receives a plurality of different voltages, the comparator may generate the control signal in response to any of a variety of scenarios it may detect. For instance, it is possible that one of the input voltages may experience a droop, while other input voltages may stay steady and not show a droop. In other instances, it is possible that each of the different input voltages may experience a similar magnitude droop or a different magnitude droop. The scope of embodiments includes any technique to programmatically trigger a control signal in response to detecting a droop phenomenon, whether it is consistent among the different input voltages or is different among the different input voltages.

An example is shown in FIG. 1, where comparator 122 asserts control signal droop_det. As noted above, this is part of a coarse control system to adjust clock frequency.

At action 530, the system causes an oscillator circuit to enter an open-loop operating mode and to divide an output frequency of the oscillator circuit in response to the control signal. For example, in the system of FIG. 1, the control signal droop_det causes the phase locked loop circuit 110 to enter an open-loop mode of operation and to output a frequency-divided clock signal. Further in that example, the operating frequency of the Digital Clock goes from 2 GHz to 1 GHz. Action 530 includes putting the oscillator circuit into an open-loop mode of operation so that further frequency adjustments, such as those of actions 540 and 550, can be implemented without internal feedback of the oscillator circuit fighting those adjustments.

Actions 520-530 represent a coarse control system. Actions 540-550 represent a fine control system that complements the coarse control system and provides the example clock frequency adjustment shown in FIGS. 2 and 3.

At action 540, the voltage measurement circuits generate frequency adjustment signals in response to the plurality of input voltages.

An example is shown at FIG. 1, where voltage sensors 102-104 output digital signals indicative of voltage levels, where those digital signals are received by control circuit 124, which programmatically processes the digital signals from the sensors 102-104 in order to provide frequency adjustment signals in response thereto. For instance, the control circuit 124 may lower oscillator frequency when voltage droop is present and may raise operating frequency when voltage increases to approach a normal operating voltage level. In the example of FIG. 1, the voltage adjustment signals include digital signals provided as droop_code.

At action 550, the system adjusts an oscillator frequency of the oscillator circuit in response to the frequency adjustment signals. As an example in FIG. 1, the oscillator 111 itself is controlled by the frequency adjustment signals droop_code. Further as an example, in FIG. 2 the clock frequency drops from 1 GHz to 900 MHz as a result of instructions from control circuit 124. Additionally, the clock frequency recovers from 1.8 GHz to 2 GHz under control of control circuit 124 after time t3.

Also, in the example of FIG. 3, the stairstep operation performed between times t2 and t3 may be controlled by another control processor (not shown) that is at the control portion 120 or at the oscillator circuit 110. Furthermore, the clock frequency recovery performed after time t3 may be performed under control of control circuit 124.

In this manner, the system of FIG. 1 provides for voltage droop compensation using a coarse control system and a fine control system. The coarse control system performs a relatively quick frequency adjustment of the clock in response to detecting the droop, and after a period of delay the fine control system begins to affect the oscillator frequency and assists in bringing the clock frequency back to its normal operating frequency. Method 500 may also include returning the oscillator circuit back to a closed loop mode of operation and resetting the comparator.

The scope of embodiments is not limited to the actions shown in FIG. 5. Other embodiments may add, omit, modify, or rearrange one or more actions. For example, the actions described above may be performed repeatedly over a period of time in which a circuit is powered on, responding to various voltage droops as they occur.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A system, comprising:
   a voltage comparator configured to receive a plurality of power supply voltages and to assert a control signal in response to detecting that one or more of the power supply voltages droops by a threshold amount;
   a phase locked loop (PLL) configured to enter an open-loop mode of operation in response to the control signal, the PLL including a frequency divider configured to divide an output frequency for the PLL and a multiplexor configured to select an output of the frequency divider in response to the assertion of the control signal;
   a plurality of voltage sensors corresponding to the plurality of power supply voltages, the voltage sensors configured to output respective digital signals indicative of a voltage level of its corresponding power supply voltage; and
   a control circuit configured to control an oscillator frequency in the PLL during the open-loop mode responsive to the respective digital signals.

2. The system of claim 1, wherein each of the voltage sensors includes a respective analog-to-digital converter configured to output a digital word in response to a sensed voltage level.

3. The system of claim 1, wherein each of the power supply voltages is supplied by a respective power supply rail.

4. The system of claim 1, including a system on chip (SOC).

5. The system of claim 1, further comprising:
   a plurality of processor cores receiving a clock signal from the PLL, wherein the clock signal comprises the output frequency of the PLL.

6. The system of claim 1, further comprising:
   a power management integrated circuit configured to provide the power supply voltages to the voltage comparator and to the plurality of voltage sensors as well as to a plurality of processing cores.

7. The system of claim 1, wherein the frequency divider is configured to divide the output frequency by n, where n is an integer.

8. The system of claim 1, wherein the PLL is a digital PLL configured to change the oscillator frequency in response to the control circuit.

9. A method comprising:
   receiving a plurality of input voltages at a voltage comparator and at a plurality of respective voltage measurement circuits;
   generating a control signal by the voltage comparator in response to determining that one or more of the input voltages droops by a threshold amount;
   in response to the control signal, causing an oscillator circuit to enter an open-loop operating mode and to divide an output frequency of the oscillator circuit;
   generating frequency adjustment signals by the voltage measurement circuits in response to the plurality of input voltages; and
   adjusting an oscillator frequency of the oscillator circuit in response to the frequency adjustment signals, wherein adjusting the oscillator frequency of the oscillator circuit in response to the frequency adjustment signals comprises:
   stopping dividing the output frequency of the oscillator circuit; and
   iteratively stepping up the oscillator frequency of the oscillator circuit to return an output clock signal to a frequency range associated with non-droop levels of the input voltage.

10. The method of claim 9, wherein the voltage measurement circuits include a plurality of analog-to-digital converters and a control circuit, further wherein generating frequency adjustment signals by the voltage measurement circuits comprises:

generating digital signals indicative of voltage levels by the plurality of analog-to-digital converters; and generating the frequency adjustment signals by the control circuit in response to the digital signals indicative of voltage levels.

11. The method of claim 9, wherein dividing the output frequency of the oscillator circuit causes the output frequency of the oscillator circuit to decrease from a first clock frequency to a second clock frequency.

12. The method of claim 9, further comprising:
maintaining the oscillator circuit in the open-loop operating mode for a pre-programmed period of time.

13. The method of claim 12, wherein adjusting the oscillator frequency of the oscillator circuit in response to the frequency adjustment signals occurs during the pre-programmed period of time.

14. The method of claim 9, further comprising:
subsequent to iteratively stepping up the oscillator frequency, returning the oscillator frequency to the first clock frequency.

15. The method of claim 9, wherein adjusting the oscillator frequency of the oscillator circuit in response to the frequency adjustment signals causes the output frequency of the oscillator circuit to decrease during the open-loop operating mode.

16. A method comprising:
receiving a plurality of power supply voltages at a plurality of respective voltage sensors, and receiving the plurality of power supply voltages at a comparator as a clock circuit operates at a first output frequency;
in a first control system, detecting a droop in at least one of the power supply voltages using the comparator, and in response to detecting the droop, causing a phase locked loop (PLL) of the clock circuit to enter an open-loop mode, and dividing the first output frequency so that the clock circuit operates at a second output frequency;
in a second control system, detecting the droop in at least one of the power supply voltages using at least one of the voltage sensors, and in response to detecting the droop, causing an oscillator of the PLL to lower its oscillating frequency; and
further comprising in the first control system:
stopping dividing the first output frequency of the clock circuit and iteratively stepping up the oscillating frequency of the oscillator in pre-programmed steps.

17. The method of claim 16, further comprising:
outputting a clock signal, corresponding to the first or second output frequency of the clock circuit, to a processor core.

18. The method of claim 16, wherein the second control system causes the oscillator of the PLL to lower its oscillating frequency during the open-loop mode of the PLL.

19. The method of claim 16, further comprising:
stopping the iteratively stepping up of the oscillating frequency before the clock circuit reaches the first output frequency; and
allowing the second control system to return the clock circuit to the first output frequency.

20. The method of claim 19, further comprising:
returning the clock circuit to the first output frequency by use of the second control system; and
returning the PLL to a closed-loop mode.

21. The method of claim 19, further comprising:
returning the clock circuit to the first output frequency by use of the second control system: and
resetting the comparator.

22. The method of claim 16, wherein the second output frequency is one half of the first output frequency.

23. The method of claim 16, wherein the second control system causes the clock circuit to operate at a third output frequency lower than the second output frequency before returning the clock circuit to the first output frequency.

24. The method of claim 16, wherein the second control system causes the oscillator of the PLL to lower its oscillating frequency subsequent to the first control system causing the PLL to enter the open-loop mode.

25. A method comprising:
receiving a plurality of power supply voltages at a plurality of respective voltage sensors, and receiving the plurality of power supply voltages at a comparator as a clock circuit operates at a first output frequency;
in a first control system, detecting a droop in at least one of the power supply voltages using the comparator, and in response to detecting the droop, causing a phase locked loop (PLL) of the clock circuit to enter an open-loop mode, and dividing the first output frequency so that the clock circuit operates at a second output frequency; and
in a second control system, detecting the droop in at least one of the power supply voltages using at least one of the voltage sensors, and in response to detecting the droop, causing an oscillator of the PLL to lower its oscillating frequency, wherein the second control system causing the oscillator of the PLL to lower its oscillating frequency results in the clock circuit operating at a third output frequency lower than the second output frequency; and
further wherein the first control system stops a dividing operation, thereby causing the clock circuit to operate at a fourth output frequency, which is a multiple of the third output frequency but lower than the first output frequency.

26. A system comprising:
a plurality of voltage inputs;
means for generating a control signal in response to determining that one or more of the voltage inputs droops by a threshold amount;
means for causing an oscillator circuit to enter an open-loop operating mode and to divide an output frequency of the oscillator circuit, including means to select a divided output frequency in response to the control signal;
means for generating frequency adjustment signals in response to the plurality of input voltages; and
means for adjusting an oscillator frequency of the oscillator circuit in response to the frequency adjustment signals.

27. The system of claim 26, wherein the oscillator circuit comprises a digital phase locked loop (PLL).

28. The system of claim 26, wherein the means for generating the control signal comprises a voltage comparator.

* * * * *